(12) United States Patent
Guo et al.

(10) Patent No.: US 12,020,901 B2
(45) Date of Patent: Jun. 25, 2024

(54) RF IMPEDANCE MATCHING NETWORKS FOR SUBSTRATE PROCESSING PLATFORM

(71) Applicant: Applied Materials, Inc., Santa Clara, CA (US)

(72) Inventors: Yue Guo, Redwood City, CA (US); Krishna Kumar Kuttannair, San Jose, CA (US); Jie Yu, Irvine, CA (US); Kartik Ramaswamy, San Jose, CA (US); Yang Yang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 480 days.

(21) Appl. No.: 17/314,173

(22) Filed: May 7, 2021

(65) Prior Publication Data

US 2022/0359161 A1  Nov. 10, 2022

(51) Int. Cl.
*H01J 37/32* (2006.01)
*H03H 7/40* (2006.01)

(52) U.S. Cl.
CPC ......... *H01J 37/32183* (2013.01); *H03H 7/40* (2013.01); *H01J 2237/334* (2013.01)

(58) Field of Classification Search
CPC ............................ H01J 37/32183; H03H 7/40
See application file for complete search history.

(56) References Cited

U.S. PATENT DOCUMENTS

| | | | |
|---|---|---|---|
| 9,059,680 B2 | 6/2015 | Shimomoto et al. | |
| 10,297,422 B2 | 5/2019 | Sato | |
| 10,741,364 B1 | 8/2020 | Lozic et al. | |
| 2005/0070123 A1 | 3/2005 | Hirano | |
| 2006/0220574 A1* | 10/2006 | Ogawa | H01J 37/32183 315/111.21 |
| 2013/0002136 A1* | 1/2013 | Blackburn | H01J 37/32183 315/111.21 |
| 2017/0301516 A1* | 10/2017 | Bhutta | H03H 7/38 |
| 2020/0286720 A1 | 9/2020 | Van Greunen et al. | |
| 2020/0328100 A1 | 10/2020 | Hirose et al. | |
| 2020/0412322 A1 | 12/2020 | Ouyang et al. | |
| 2023/0230805 A1* | 7/2023 | Drewery | H01J 37/32174 315/111.21 |

FOREIGN PATENT DOCUMENTS

WO  WO 2020/223129 A1  11/2020

OTHER PUBLICATIONS

PCT International Search Report and Written Opinion for PCT/US2022/027230 dated Aug. 23, 2022.

\* cited by examiner

*Primary Examiner* — Henry Luong
(74) *Attorney, Agent, or Firm* — MOSER TABOADA (57) ABSTRACT

Methods and apparatus using a matching network for processing a substrate are provided herein. For example, a matching network configured for use with a plasma processing chamber comprises a local controller connectable to a system controller of the plasma processing chamber, a first motorized capacitor connected to the local controller, a second motorized capacitor connected to the first motorized capacitor, a first sensor at an input of the matching network and a second sensor at an output of the matching network for obtaining in-line RF voltage, current, phase, harmonics, and impedance data, respectively, and an Ethernet for Control Automation Technology (EtherCAT) communication interface connecting the local controller to the first motorized capacitor, the second motorized capacitor, the first sensor, and the second sensor.

20 Claims, 5 Drawing Sheets

RF IMPEDANCE MATCHING NETWORKS FOR SUBSTRATE PROCESSING PLATFORM

FIELD

Embodiments of the present disclosure generally relate to substrate processing platform, and more particularly, to RF impedance matching networks for substrate processing platform.

BACKGROUND

Conventional plasma processing chambers (reactors) can include one or more RF impedance matching networks, which can include a local controller, used between an RF source and the plasma processing chamber to optimize power efficiency, which is typically developed based on serial communication protocols. Matching network settings and tuning algorithms can be stored on a local memory, and at a tuned matching point, maximum power is delivered from the RF source into a plasma load, with near zero power being reflected back to the RF source. The local controller is developed based on serial communication protocols, e.g., RS-232 or RS-485, and monitors data from one or more match sensors and automatically adjusts one or more motorized variable capacitors using a tuning algorithm. In some instances, such as when multiple RF frequencies are used, the corresponding matching networks are isolated from each other and work independently from each other.

SUMMARY

Methods and apparatus using a matching network for processing a substrate are provided herein. In at least some embodiments, a matching network configured for use with a plasma processing chamber comprises a local controller connectable to a system controller of the plasma processing chamber, a first motorized capacitor connected to the local controller, a second motorized capacitor connected to the first motorized capacitor, a first sensor at an input of the matching network and a second sensor at an output of the matching network for obtaining in-line RF voltage, current, phase, harmonics, and impedance data, respectively, and an Ethernet for Control Automation Technology (EtherCAT) communication interface connecting the local controller to the first motorized capacitor, the second motorized capacitor, the first sensor, and the second sensor.

In accordance with at least some embodiments, a plasma processing system comprises an RF generator, a plasma processing chamber connected to the RF generator and comprising a system controller configured for processing a substrate, and a matching network comprising a local controller connectable to the system controller of the plasma processing chamber, a first motorized capacitor connected to the local controller, a second motorized capacitor connected to the first motorized capacitor, a first sensor at an input of the matching network and a second sensor at an output of the matching network for obtaining in-line RF voltage, current, phase, harmonics, and impedance data, respectively, and an Ethernet for Control Automation Technology (EtherCAT) communication interface connecting the local controller to the first motorized capacitor, the second motorized capacitor, the first sensor, and the second sensor.

In accordance with at least some embodiments, a plasma processing system comprises a first RF generator and a second RF generator, a plasma processing chamber connected to each of the first RF generator and the second RF generator and comprising a system controller configured for processing a substrate, and a first matching network and a second matching network each comprising a first motorized capacitor, a second motorized capacitor connected to the first motorized capacitor, a first sensor at an input and a second sensor at an output for obtaining in-line RF voltage, current, phase, harmonics, and impedance data, respectively, wherein the first motorized capacitor of the first matching network is connected to the first motorized capacitor of the second matching network, and an Ethernet for Control Automation Technology (EtherCAT) communication interface connecting at least one of a local controller or the system controller to the to the first motorized capacitor, second motorized capacitor, first sensor, and second sensor of each of the first matching network and the second matching network.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate processing platform are provided herein. For example, apparatus described herein use one or more matching networks that can connect to one or more RF power sources and a plasma processing chamber. The one or more components of the matching networks communicate with each other via ethernet for control automation technology (EtherCAT). Accordingly, the matching networks described herein provide advantages in performance, flexibility, and extensibility, as the EtherCAT provides fast tuning speeds, short response time, and cooperative intelligent real time control. In addition, the disclosed EtherCAT based distributed matching networks described herein provide improved tuning reliability, system extensibility, and enable advanced tuning algorithms for sophisticated voltage waveform engineering applications.

Figure 1:
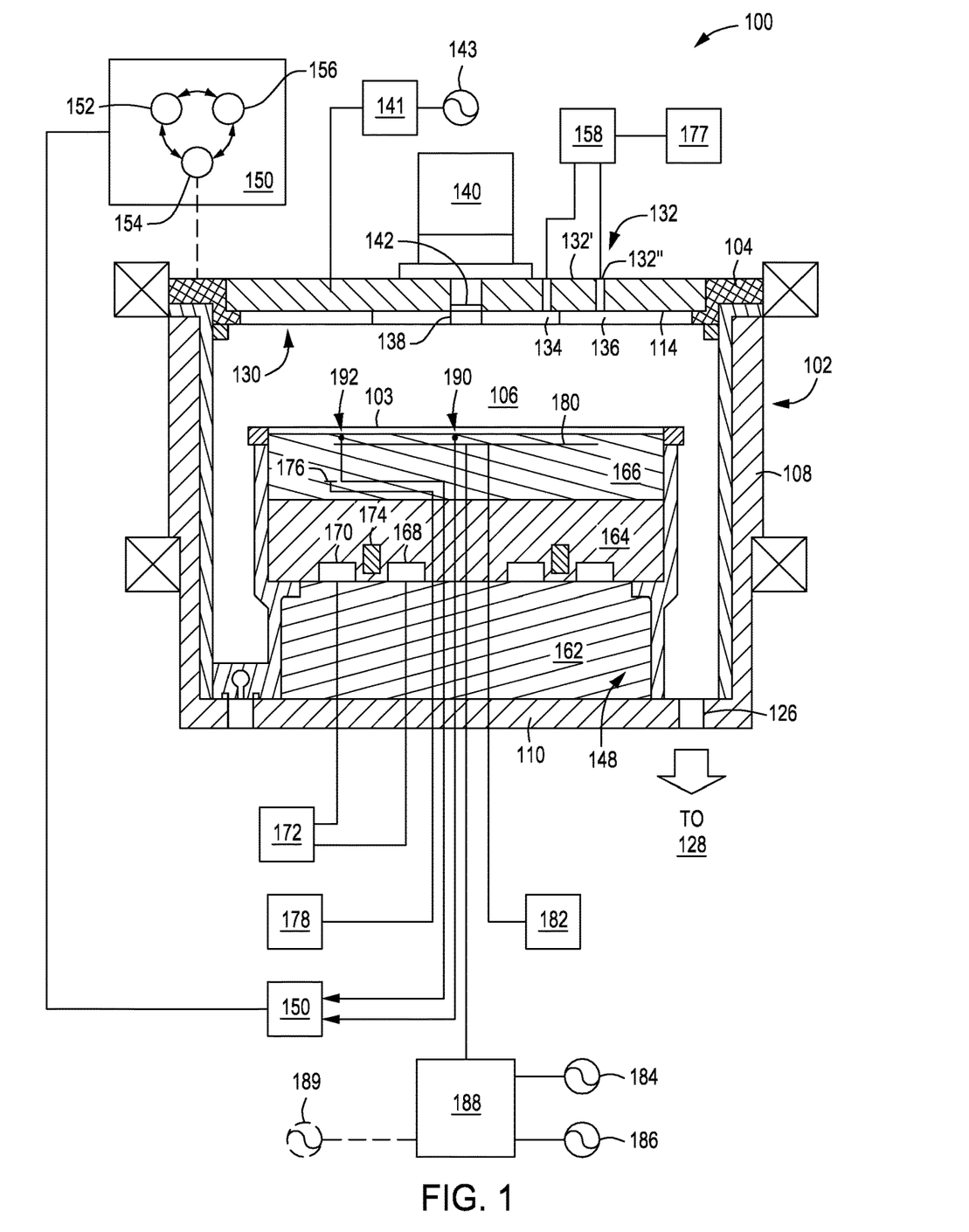
FIG. 1 is a cross-sectional diagram of a processing chamber, in accordance with at least some embodiments of the present disclosure.

FIG. 1 is a sectional view of one example of plasma processing system comprising a processing chamber 100 suitable for performing one or more plasma processes in accordance with the present disclosure. Suitable processing chambers that may be adapted for use with the teachings disclosed herein include, for example, one or more etch processing chambers available from Applied Materials, Inc. of Santa Clara, CA Other processing chambers may be adapted to benefit from one or more of the methods of the present disclosure.

The processing chamber 100 includes a chamber body 102 and a chamber lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

The chamber lid 104 is sealingly supported on the sidewall 108 of the chamber body 102. The chamber lid 104 may be opened to allow excess to the interior volume 106 of the processing chamber 100. The chamber lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the chamber lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed.

In embodiments, a gas panel 158 is coupled to the processing chamber 100 to provide process and/or cleaning gases to the interior volume 106. In the example depicted in FIG. 1, inlet ports 132', 132" are provided in the chamber lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $O_2$, $CO_2$, $N_2O$, $NO_2$, $O_3$, $H_2O$, and the like. Non-limiting examples of nitrogen containing gas includes $N_2$, $NH_3$, and the like. Non-limiting examples of chlorine containing gas includes HCl, $Cl_2$, $CCl_4$, and the like. In embodiments, a showerhead assembly 130 is coupled to an interior surface 114 of the chamber lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the chamber lid 104.

In one embodiment, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through inlet ports 132', 132".

In some embodiments, the substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown)

in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises an electrode 180 (e.g., a clamping electrode) for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum, or gravity.

A base 164 or electrostatic chuck 166 may include a heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

In one embodiment, the substrate support pedestal assembly 148 is configured as a cathode and includes an electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 or the chamber lid 104) of the chamber body 102. The RF bias power excites and sustains a plasma discharge formed from the gases disposed in the processing region of the chamber body 102.

Still referring to FIG. 1, in some embodiments the dual RF bias power sources 184, 186 are coupled to the electrode 180 disposed in the substrate support pedestal assembly 148 through one or more matching networks 188 (one matching network showed in FIG. 1). The matching network 188 is connected to the RF bias power sources 184, 186 through a 50Ω transmission line. The RF bias power source 184 and the RF bias power source 186 can supply power at frequencies between 100 kHz and 200 MHz. In at least some embodiments, a transistor-transistor logic (TTL) signal can be provided to an input sensor and an output sensor of the matching network 188 directly from the RF bias power source 184 and the RF bias power source 186 for fast response and short tune time. The signal generated by the RF bias power source 184 and the RF bias power source 186 is delivered through matching network 188 to the substrate support pedestal assembly 148 through a single feed to ionize the gas mixture provided in the plasma processing chamber such as processing chamber 100, thus providing ion energy necessary for performing an etch deposition or other plasma enhanced process. The RF bias power source 184 and the RF bias power source 186 are generally capable of producing an RF signal having a frequency of from about 100 kHz to about 200 MHz (e.g., about 13.56 MHz+/−5%) and a power between about 0 Watts and about 6000 Watts (e.g., from about 50 W for low-power operation to about 6000 W for high-power operation), 1 Watt (W) to about 100 W, or about 1 W to about 30 W. A bias power 189 may be coupled to the electrode 180 to control the characteristics of the plasma.

During operation, the substrate 103 is disposed on the substrate support pedestal assembly 148 in the plasma processing chamber such as the processing chamber 100. A process gas and/or gas mixture is introduced into the chamber body 102 through the showerhead assembly 130 from the gas panel 158. A vacuum pump system such as pump system 128 maintains the pressure inside the chamber body 102 while removing deposition by-products.

A controller 150 (e.g., a system controller) is coupled to the processing chamber 100 to control operation of the processing chamber 100. The controller 150 includes a central processing unit 152, a memory 154, and a support circuit 156 utilized to control the process sequence and regulate the gas flows from the gas panel 158. The central processing unit 152 may be any form of general-purpose computer processor that may be used in an industrial setting. The software routines can be stored in the memory 154, such as random-access memory, read only memory, floppy, or hard disk drive, or other form of digital storage. The support circuit 156 is conventionally coupled to the central processing unit 152 and may include cache, clock circuits, input/output systems, power supplies, and the like. Bi-directional communications between the controller 150 and the various components of the processing chamber 100 are handled through numerous signal cables.

In at least some embodiments, the controller 150 can communicate with the RF bias power source 184 and the RF bias power source 186 (and/or bias power 189), a matching network controller, and all components in a matching network via EtherCAT, thus providing advanced multi-frequency superimposed plasma etching capability, as will be described in greater detail below.

Figure 2:
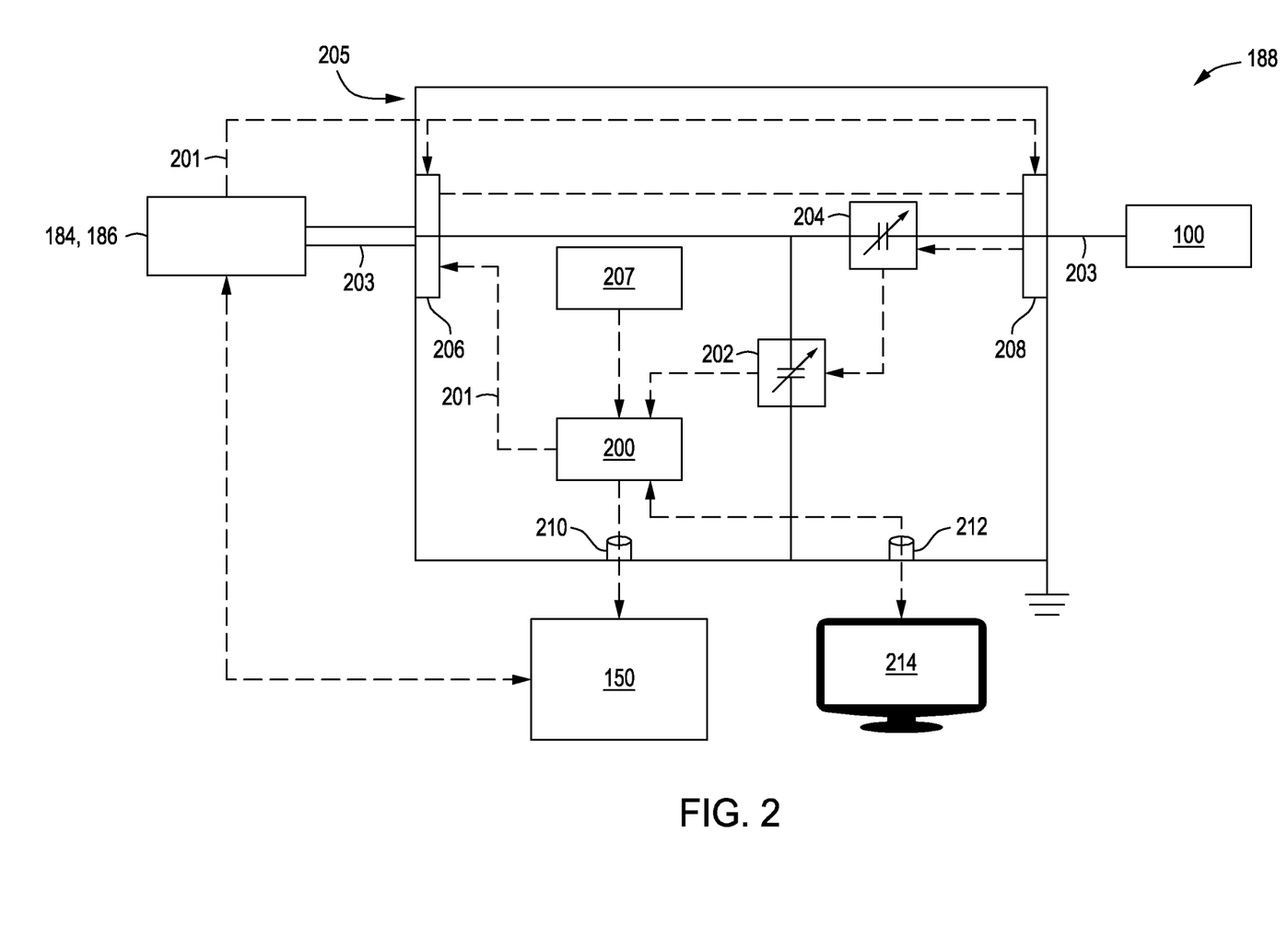
FIG. 2 is a block diagram of a matching network, in accordance with at least some embodiments of the present disclosure.

FIG. 2 is a block diagram of the matching network 188 configured for use with the processing chamber 100, in accordance with at least some embodiments of the present disclosure. In at least some embodiments, the matching network 188 can be an L type or Pi type matching network.

The matching network 188 comprises a local controller, one or more sensors, and one or more motorized capacitors all of which are connected via EtherCAT (illustrated by the dashed lines 201). EtherCAT is a real time industrial Ethernet protocol, and due to short cycle time and low jitter, EtherCAT provides high speed and accurate synchronization during plasma processing. One or more other interfaces can be used to connect the components of the matching network 188 to each other and/or an RF generator and a plasma processing chamber to the matching network 188. For example, a transmission line 203 (illustrated by the solid lines) can be used to connect an RF generator to the matching network 188 and the matching network 188 to the plasma processing chamber, e.g., in order to supply RF power to the plasma processing chamber.

In at least some embodiments, a local controller 200 functions as a local EtherCAT master, and all matching network components, e.g., sensors, motorized capacitors, are EtherCAT slave devices, which are controlled by the local controller 200. For example, a command sent by the local controller 200 (e.g., EtherCAT master controller) passes to all EtherCAT slave devices. A first motorized capacitor 202 (vacuum capacitor) with EtherCAT interface can be connected to the local controller 200 and to a second motorized capacitor 204 (vacuum capacitor) with EtherCAT interface. The first motorized capacitor 202 can be connected to the second motorized capacitor 204 in a serial or parallel configuration. For example, in the illustrated embodiment, the first motorized capacitor 202 is connected in parallel with the second motorized capacitor 204. The first motorized capacitor and the second motorized capacitor 204 are motorized variable capacitors and are configured to be adjusted during operation. For example, the local controller can be configured to adjust the first motorized capacitor and the second motorized capacitor 204 to minimize reflected power during plasma processing.

The local controller 200 can be connected (directly or indirectly) to a first sensor 206 disposed at an input of the matching network 188 and a second sensor 208 disposed at an output of the matching network 188 for obtaining in-line RF voltage, current, phase, harmonics, and impedance data, respectively. In at least some embodiments, the first sensor 206 and the second sensor 208 can be multi-frequency voltage/current probes. The measured data can be used for automatic impedance tuning, load impedance monitoring, etc.

In at least some embodiments, an interlock circuitry 207 can be connected to the local controller 200 and configured prevent RF generator failure. For example, the interlock circuitry 207 can comprise fault protection circuitries that are configured to shut down RF power output from an RF generator when reflected RF power exceeds a certain percentage of forward power (e.g., >20%), which is RF power sent by an RF generator through the matching network 188 to the load, e.g., plasma in a processing chamber.

As noted above, EtherCAT communication interface connects the local controller 200 to the first motorized capacitor 202, the second motorized capacitor 204, the first sensor 206, and the second sensor 208. The EtherCAT communication interface directly connects an RF generator (e.g., RF bias power sources 184, 186 (and/or bias power 189)) to each of the first sensor 206 and the second sensor 208 for transmitting a TTL signal 205 from the RF generator to each of the first sensor 206 and the second sensor 208, e.g., for fast response and short tune time.

In at least some embodiments, when connected to an RF generator and to a plasma processing chamber, the local controller 200 is configured as an EtherCAT master device, which controls and monitors local EtherCAT slave devices, such as sensors and stepper motors. The local controller 200 is also integrated with an EtherCAT slave controller, so that the local controller 200 can act as an EtherCAT slave device and the controller 150 works as an EtherCAT master device. That is, the local controller 200 is configured to perform a master to slave conversion with the controller 150. The tool controller can be implemented on an industrial computer and embedded with required drivers. In such embodiments, the local controller 200 can receive feedback requests from the controller 150 and provide feedback thereto during plasma processing. For example, the local controller 200 can receive in-line RF voltage, current, phase, harmonics, and impedance data obtained via the first sensor 206 and the second sensor 208. Sensor data and variable capacitor positions can be transmitted to the controller 150, and combined with other system processing data, such as forward and reflected power data from the RF bias power source 184 and the RF bias power source 186, thus creating cooperative intelligent real time control during operation.

The matching network 188 can comprise at least one of a first network port 210, (e.g., a dual RJ45 type port) configured to connect to the controller 150 and a second serial port configured to connect to an external computing device for manual control of the matching network 188 (e.g., laptop or other suitable computing device). For example, in at least some embodiments, the controller 150 can connect to a first network port 210 of the matching network 188 for plasma process control. The local controller 200 can receive in-line RF voltage, current, phase, harmonics, and impedance data obtained via the first sensor 206 and the second sensor 208. Sensor data and variable capacitor positions can be transmitted to the controller 150, and combined with other system processing data, such as forward and reflected power data from the RF bias power source 184 and the RF bias power source 186, thus creating cooperative intelligent real time control during operation. In at least some embodiments, the matching network 188 can include a second serial port 212 that is configured to connect to a computing device 214 for algorithm uploading and for manual control of the matching network, e.g., by using an external software and application programming interface (API). In at least some embodiments, the external software and API can be uploaded and stored the memory 154 and accessed by the controller 150 and/or in a memory (not shown) of the local controller 200. In at least some embodiments, sensor data, which can be obtained from the first sensor 206 and the second sensor 208, can be accessed from the computing device 214. Additionally, when connected to the second serial port 212, the computing device 214 can be configured to control the first motorized capacitor 202 and the second motorized capacitor 204. Providing the first network port 210 and the second serial port 212 provides the matching network 188 with great flexibility when compared to conventional matching networks. For example, advanced process related control algorithms can be deployed in real time and the matching network 188 can operate fully autonomously, cooperatively with the controller 150 and/or manually controlled via the computing device 214. During processing, if needed, the EtherCAT based distributed RF impedance matching networks described herein allows a user using a computing device 214 to fully control the matching network 188 and components associated therewith.

Figure 3:
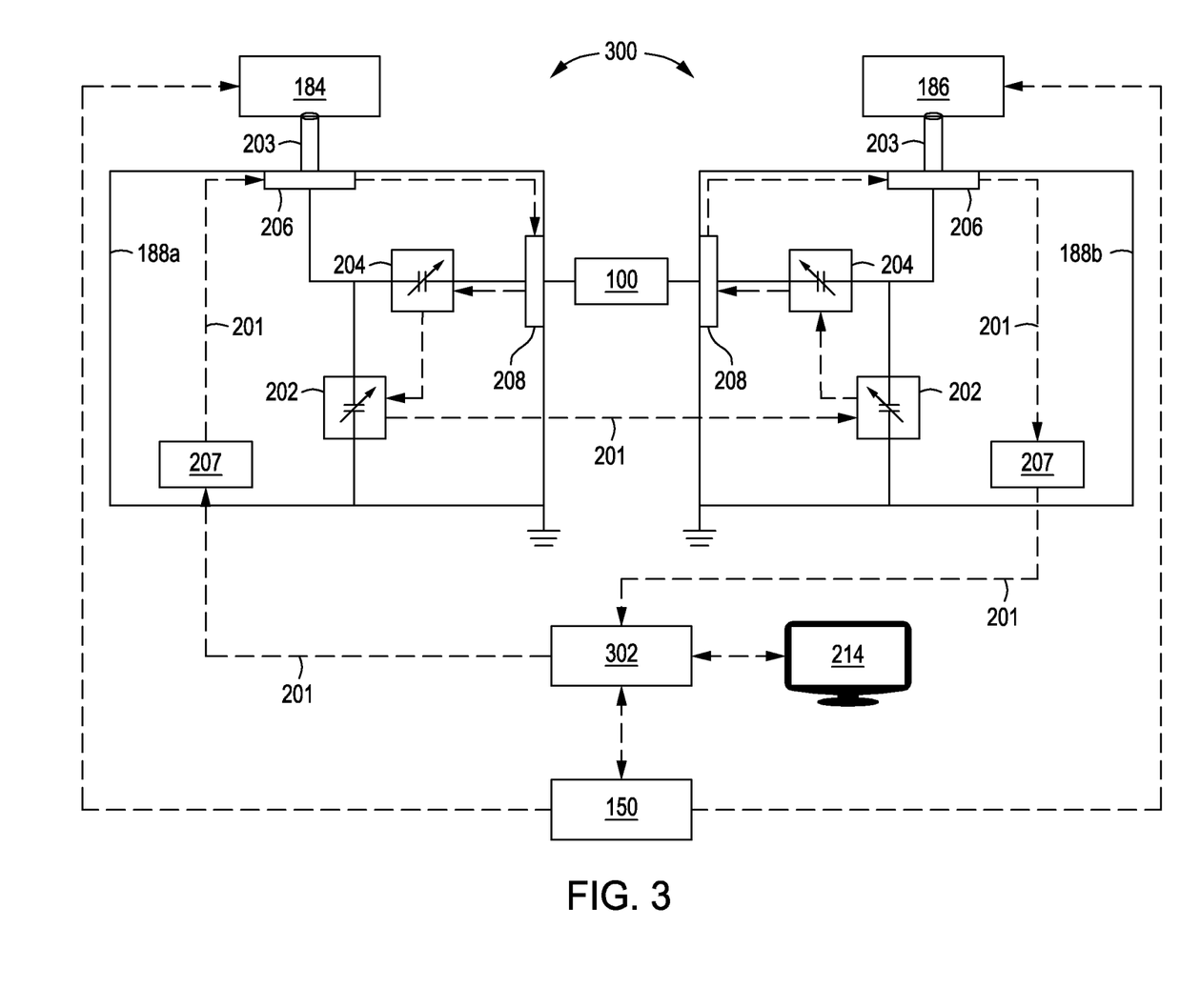
FIG. 3 is a block diagram of a dual-frequency matching network, in accordance with at least some embodiments of the present disclosure.

FIG. 3 is a block diagram of a dual-frequency matching network 300, in accordance with at least some embodiments of the present disclosure. For example, a dual-frequency matching network 300 with external local controller is illustrated. The dual-frequency matching network 300 in FIG. 3 is substantially similar to the matching network 188 of FIG. 2. Accordingly, only those features that are unique to the dual-frequency matching network 300 in FIG. 3 are described herein.

For example, the dual-frequency matching network 300 can comprise two independent matching networks, e.g., a matching network 188a and a matching network 188b that are controlled by an external common controller 302. Unlike the local controller 200, the external common controller 302 in FIG. 3 is located outside (external) of the matching network 188a and the matching network 188b. The external common controller 302 can communicate with the controller 150 using either TCP/IP or EtherCAT protocols and ports. The external common controller 302 can also be accessed by a computing device (e.g., laptop) via, for example, one or more of the serial ports described above.

In the embodiment of FIG. 3, the RF bias power source 184 and the RF bias power source 186 are connected to a matching network 188a and matching network 188b and are synchronized and controlled by the controller 150. Additionally, the first motorized capacitors 202 of the matching network 188a and the matching network 188b are connected to each other via EtherCAT. Moreover, the interlock circuitry 207 of the matching network 188a and the matching network 188b is directly connected to a first sensor 206 and stepper motors of corresponding vacuum variable capacitors in the same loop. When a system fault or unexpected condition is detected or predicted from user defined models, safety interlocks can be triggered in sub-millisecond time scale for system protection.

In the configuration of FIG. 3, the external common controller 302 can provide fast tuning speeds and short response times. Additionally, the controller 150 can enable cooperative intelligent real time control, improve tuning reliability, and provide system extensibility. An additional control port (not shown, e.g., a serial port configured to connect to a computing device) gives the RF matching network improved flexibility for advanced process related tuning algorithm deployment. User defined tuning algorithm with different control parameters can be loaded for different process conditions.

Figure 4:
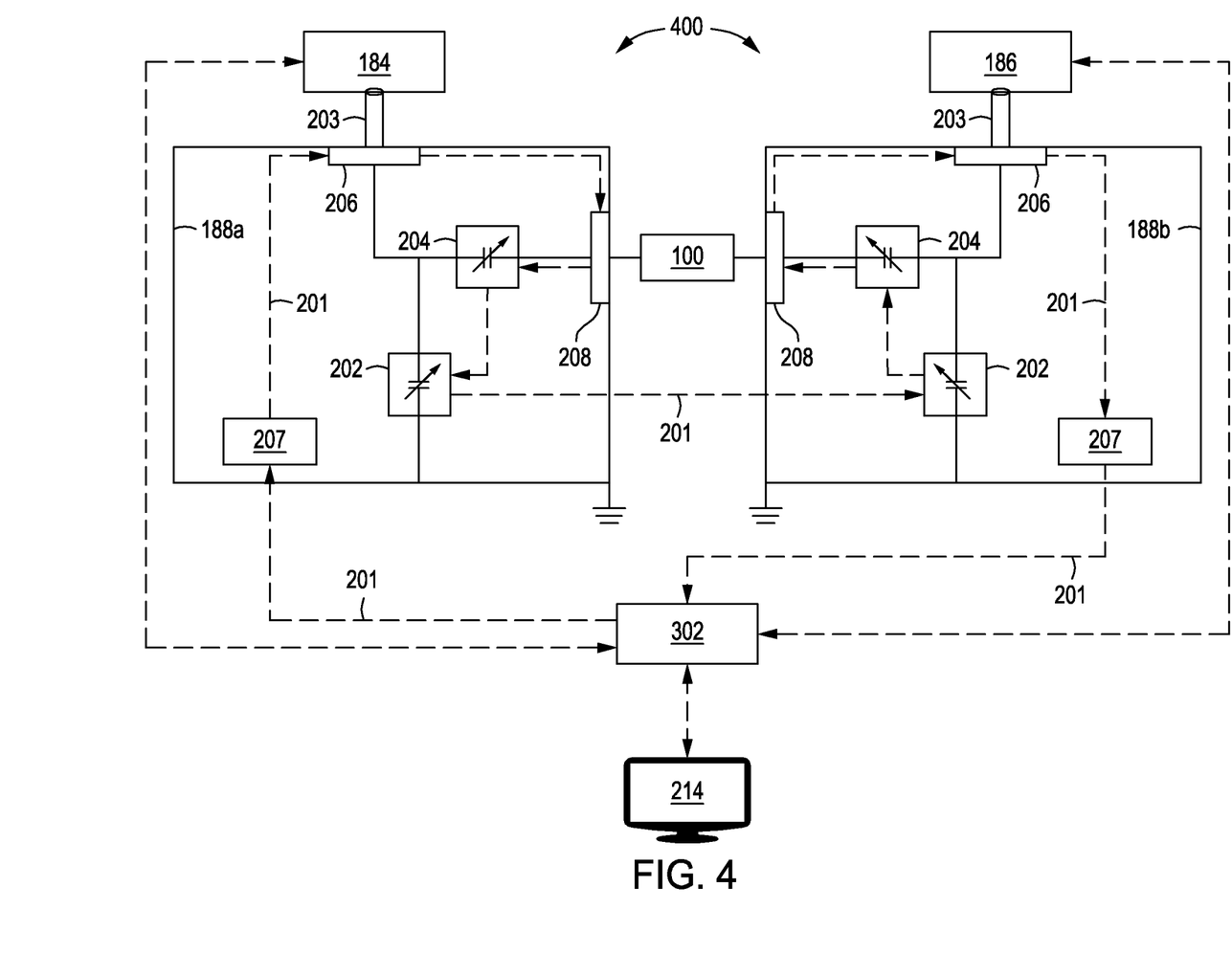
FIG. 4 is a block diagram of a dual-frequency matching network, in accordance with at least some embodiments of the present disclosure.

FIG. 4 is a block diagram of a dual-frequency matching network 400, in accordance with at least some embodiments of the present disclosure. The dual-frequency matching network 400 in FIG. 4 is substantially similar to the dual-frequency matching network 300 of FIG. 3. Accordingly, only those features that are unique to the dual-frequency matching network 400 in FIG. 4 are described herein.

In the embodiment of FIG. 4. the local controller 200 and the external common controller 302 are not used and the controller 150 can communicate with both the RF bias power source 184 and the RF bias power source 186 and all components in matching network 188a and the matching network 188b. Accordingly, advanced multi-frequency superimposed plasma etching can be achieved. Additionally, dual even harmonic generators with an accurate locked phase can be used to manipulate voltage waveforms. For example, the RF bias power source 184 can have a frequency of about 13.56 MHz, while the RF bias power source 186 can have a frequency of about 27.12 MHz. Alternatively, with odd harmonic dual frequency, the RF bias power source 184 can have a fundamental frequency of 13.56 MHz, while the RF bias power source 186 can have an odd frequency of 40.68 MHz. Thus, a full range control of plasma properties can be achieved by changing phase and magnitude of multiple frequencies.

In a standard control mode, motorized vacuum capacitors can be tuned based on readings of sensors that are in the same match box enclosure (e.g., matching network enclosure). Alternatively or additionally, the EtherCAT based distributed RF impedance matching networks described herein enable advanced component regrouping capability, wherein components that are physically separated in different match box enclosures, can virtually regroup for various process requirements. For example, as shown in FIG. 4, the first motorized capacitor 202 and second motorized capacitor 204 are in the $1^{st}$ match box enclosure (e.g., the matching network 188a), while the first motorized capacitor 202 and second motorized capacitor 204 are in the $2^{nd}$ match box enclosure (e.g., the matching network 188b). The EtherCAT based distributed RF impedance matching network can regroup the first motorized capacitor 202 and second motorized capacitor 204 in the $1^{st}$ match box enclosure with the second motorized capacitor 204 in the $2^{nd}$ match box enclosure as a new virtual match, which can tune based on readings of one or more of the sensors in the $1^{st}$ match box enclosure (or $2^{nd}$ match box enclosure). For example, in at least one embodiments, the EtherCAT based distributed RF impedance matching network can regroup the first motorized capacitor 202 and second motorized capacitor 204 in the $1^{st}$ match box enclosure with the second motorized capacitor 204 in the $2^{nd}$ match box enclosure as a new virtual match which can tune based on readings of the first sensor 206. In at least some embodiments, other regrouping scenarios can also be used (e.g., the first motorized capacitor 202 and second motorized capacitor 204 in the $2^{nd}$ match box enclosure with the first motorized capacitor 202 in the $1^{st}$ match box enclosure).

Figure 5:
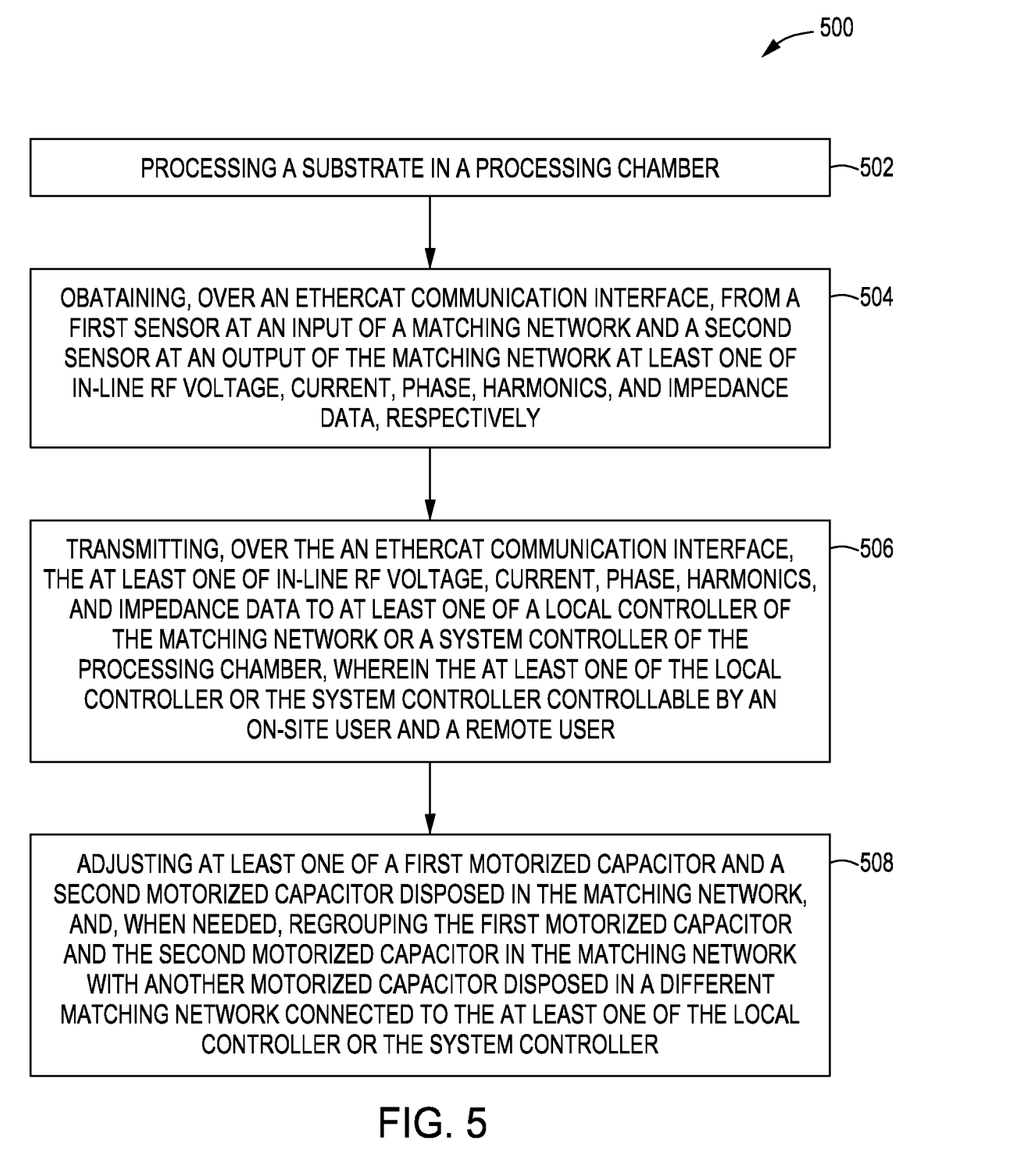
FIG. 5 is a flowchart of a method for processing a substrate, in accordance with at least some embodiments of the present disclosure.

Accordingly, at 502 a method 500 can comprise processing a substrate in a processing chamber. Next, at 504 the method 500 can comprise obtaining, over an EtherCAT communication interface, from a sensor in a matching network (match box enclosure) at least one of in-line RF voltage, current, phase, harmonics, and impedance data. Next, at 506 the method 500 can comprise transmitting, over the EtherCAT communication interface, the at least one of in-line RF voltage, current, phase, harmonics, and impedance data to at least one of a local controller of the matching network or a system controller of the processing chamber, wherein the at least one of the local controller or the system controller are controllable by an on-site user and/or a remote user. Next, at 508 the method 500 can comprise adjusting at least one of a first motorized capacitor and a second motorized capacitor disposed in the matching network, and, when needed, regrouping the first motorized capacitor and the second motorized capacitor in the matching network with another motorized capacitor disposed in a different matching network (match box enclosure) connected to the at least one of the local controller or the system controller.

The matching networks described herein can provide a full range of control of plasma properties (e.g., etching properties) by changing a phase and a magnitude of multiple frequencies used by the RF bias power source 184 and the RF bias power source 186, e.g., the matching networks can tune two harmonically related generators seamlessly. For example, all sensor readings obtained from the first sensor 206 and the second sensor 208 can be sent to the controller 150 via the local controller 200 over EtherCAT for advanced correlated tuning, and sheath voltage can be customized on a sub-millisecond time scale. When more harmonically related generators are used, e.g., for a complicated voltage waveform, the EtherCAT based distributed matching network 188 can tune all frequencies based solely on voltage and current sensor readings from the first sensor 206 and the second sensor 208 of a fundamental frequency.

While the foregoing is directed to embodiments of the present disclosure, other and further embodiments of the disclosure may be devised without departing from the basic scope thereof.

The invention claimed is:
1. A matching network configured for use with a plasma processing chamber, comprising:
   a local controller connectable to a system controller of the plasma processing chamber;

a first motorized capacitor connected to the local controller;
a second motorized capacitor connected to the first motorized capacitor;
a first sensor at an input of the matching network and a second sensor at an output of the matching network for obtaining in-line RF voltage, current, phase, harmonics, and impedance data, respectively; and
at least one of a first communication port configured to connect to at least one of the local controller or the system controller and a second communication port configured to connect to an external computing device for manual control of the matching network;
an Ethernet for Control Automation Technology (EtherCAT) communication interface connecting the local controller to the first motorized capacitor, the second motorized capacitor, the first sensor, and the second sensor.

2. The matching network of claim 1, further comprising an interlock circuitry connected to the local controller and configured to shut down RF power output from an RF generator when reflected RF power exceeds a certain percentage of forward power.

3. The matching network of claim 1, wherein the first motorized capacitor is connected in parallel with the second motorized capacitor.

4. The matching network of claim 1, wherein the matching network is one of an L type or a Pi type.

5. The matching network of claim 1, wherein the first communication port is a first serial port and the second communication port is a second serial port.

6. The matching network of claim 1, wherein the EtherCAT communication interface directly connects an RF generator to each of the first sensor and the second sensor for transmitting a TTL signal from the RF generator to each of the first sensor and the second sensor.

7. The matching network of claim 1, wherein the local controller is an EtherCAT master device and the first motorized capacitor, the second motorized capacitor, the first sensor, and the second sensor are EtherCAT slave devices, and
wherein, when connected, the local controller is configured to perform a master to slave conversion so that the system controller is the EtherCAT master device and the local controller is EtherCAT slave device.

8. A plasma processing system comprising:
an RF generator;
a plasma processing chamber connected to the RF generator and comprising a system controller configured for processing a substrate; and
a matching network comprising:
a local controller connectable to the system controller of the plasma processing chamber;
a first motorized capacitor connected to the local controller;
a second motorized capacitor connected to the first motorized capacitor;
a first sensor at an input of the matching network and a second sensor at an output of the matching network for obtaining in-line RF voltage, current, phase, harmonics, and impedance data, respectively;
at least one of a first communication port configured to connect to at least one of the local controller or the system controller and a second communication port configured to connect to an external computing device for manual control of the matching network; and
an Ethernet for Control Automation Technology (EtherCAT) communication interface connecting the local controller to the first motorized capacitor, the second motorized capacitor, the first sensor, and the second sensor.

9. The plasma processing system of claim 8, wherein the matching network further comprises an interlock circuitry connected to the local controller and configured to shut down RF power output from the RF generator when reflected RF power exceeds a certain percentage of forward power.

10. The plasma processing system of claim 8, wherein the first motorized capacitor is connected in parallel with the second motorized capacitor.

11. The plasma processing system of claim 8, wherein the matching network is one of an L type or a Pi type.

12. The plasma processing system of claim 8, wherein the first communication port is a first serial port and the second communication port is a second serial port.

13. The plasma processing system of claim 8, wherein the EtherCAT communication interface directly connects the RF generator to each of the first sensor and the second sensor for transmitting a TTL signal from the RF generator to each of the first sensor and the second sensor.

14. The plasma processing system of claim 8, wherein the local controller is an EtherCAT master device and the first motorized capacitor, the second motorized capacitor, the first sensor, and the second sensor are EtherCAT slave devices, and
wherein, when connected, the local controller is configured to perform a master to slave conversion so that the system controller is the EtherCAT master device and the local controller is EtherCAT slave device.

15. A plasma processing system comprising:
a first RF generator and a second RF generator;
a plasma processing chamber connected to each of the first RF generator and the second RF generator and comprising a system controller configured for processing a substrate; and
a first matching network and a second matching network each comprising:
a first motorized capacitor;
a second motorized capacitor connected to the first motorized capacitor;
a first sensor at an input and a second sensor at an output for obtaining in-line RF voltage, current, phase, harmonics, and impedance data, respectively, wherein the first motorized capacitor of the first matching network is connected to the first motorized capacitor of the second matching network;
at least one of a first communication port configured to connect to at least one of the local controller or the system controller and a second communication port configured to connect to an external computing device for manual control of the matching network; and
an Ethernet for Control Automation Technology (EtherCAT) communication interface connecting at least one of a local controller or the system controller to the to the first motorized capacitor, second motorized capacitor, first sensor, and second sensor of each of the first matching network and the second matching network.

16. The plasma processing system of claim 15, wherein each of the first matching network and the second matching network further comprises an interlock circuitry connected to at least one of the local controller or the system controller and configured to shut down RF power output from an RF generator when reflected RF power exceeds a certain percentage of forward power.

17. The plasma processing system of claim 15, wherein the first motorized capacitor is connected in parallel with the second motorized capacitor.

18. The plasma processing system of claim 15, wherein the first matching network and the second matching network is one of an L type or a Pi type.

19. The plasma processing system of claim 15, wherein the first communication port is a first serial port and the second communication network is a second serial port configured.

20. The plasma processing system of claim 15, wherein the EtherCAT communication interface directly connects the first RF generator and the second RF generator to each of the first sensor and the second sensor for transmitting a TTL signal from the first RF generator and the second RF generator to each of the first sensor and the second sensor.

* * * * *